(12) United States Patent
Chang et al.

(10) Patent No.: US 8,501,603 B2
(45) Date of Patent: Aug. 6, 2013

(54) METHOD FOR FABRICATING HIGH VOLTAGE TRANSISTOR

(75) Inventors: Chih-Kuang Chang, Hsinchu County (TW); Hsin-Hsueh Hsieh, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 295 days.

(21) Appl. No.: 13/160,771

(22) Filed: Jun. 15, 2011

(65) Prior Publication Data

US 2012/0322247 A1    Dec. 20, 2012

(51) Int. Cl.
*H01L 21/00*    (2006.01)

(52) U.S. Cl.
USPC .......................................... 438/526; 438/228

(58) Field of Classification Search
USPC .......................................... 438/526, 225–228
See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen et al. |
| 6,064,105 A | 5/2000 | Li |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,614,089 B2 | 9/2003 | Nakamura |
| 6,713,794 B2 | 3/2004 | Suzuki |
| 6,762,098 B2 | 7/2004 | Hshieh et al. |
| 6,764,890 B1 | 7/2004 | Xu |
| 6,784,060 B2 | 8/2004 | Ryoo |
| 6,784,490 B1 | 8/2004 | Inoue |

(Continued)

*Primary Examiner* — Richard Booth
(74) *Attorney, Agent, or Firm* — WPAT, PC; Justin King

(57) ABSTRACT

A method for fabricating a high voltage transistor includes the following steps. Firstly, a substrate is provided. A first sacrificial oxide layer and a hard mask layer are sequentially formed over the substrate. The hard mask layer is removed, thereby exposing the first sacrificial oxide layer. Then, a second sacrificial oxide layer is formed on the first sacrificial oxide layer. Afterwards, an ion-implanting process is performed to introduce a dopant into the substrate through the second sacrificial oxide layer and the first sacrificial oxide layer, thereby producing a high voltage first-type field region of the high voltage transistor.

12 Claims, 4 Drawing Sheets

U.S. PATENT DOCUMENTS

| | | |
|---|---|---|
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 7,785,974 B2 * | 8/2010 | Hu et al. ............ 438/309 |
| 2002/0106852 A1 | 8/2002 | He |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0081924 A1 | 4/2006 | Ichikawa |
| 2006/0261407 A1 | 11/2006 | Blanchard |
| 2006/0270134 A1 | 11/2006 | Lee |
| 2006/0270171 A1 | 11/2006 | Chen |
| 2007/0040212 A1 | 2/2007 | Cai |
| 2007/0082440 A1 | 4/2007 | Shiratake |
| 2007/0132033 A1 | 6/2007 | Wu |
| 2007/0273001 A1 | 11/2007 | Chen |
| 2007/0294865 A1 | 12/2007 | Sano |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0041227 A1 | 2/2009 | Altberg |
| 2009/0108348 A1 | 4/2009 | Yang |
| 2009/0111252 A1 | 4/2009 | Huang |
| 2009/0159966 A1 | 6/2009 | Huang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |

* cited by examiner

000# METHOD FOR FABRICATING HIGH VOLTAGE TRANSISTOR

FIELD OF THE INVENTION

The present invention relates to a method for fabricating a semiconductor device, and more particularly to a method for fabricating a high voltage transistor.

BACKGROUND OF THE INVENTION

Generally, an integrated circuit chip includes a logic function circuit and a power supply circuit. The logic function circuit is implemented by a complementary metal-oxide-semiconductor (CMOS) transistor. The power supply circuit is implemented by a high voltage metal-oxide-semiconductor field-effect transistor. However, the conventional isolated high voltage N-channel metal-oxide-semiconductor field-effect transistor (also referred as an isolated HV-NMOS) has some drawbacks. For example, due to the structural defect, a current leakage problem possibly occurs, and thus the charge pump circuit usually has a failure. Therefore, there is a need of providing an improved method to solve these drawbacks.

SUMMARY OF THE INVENTION

In accordance with an aspect, the present invention provides a method for fabricating a high voltage transistor. The method includes the following steps. Firstly, a substrate is provided. A first sacrificial oxide layer and a hard mask layer are sequentially formed over the substrate. The hard mask layer is removed, thereby exposing the first sacrificial oxide layer. Then, a second sacrificial oxide layer is formed on the first sacrificial oxide layer. Afterwards, an ion-implanting process is performed to introduce a dopant into the substrate through the second sacrificial oxide layer and the first sacrificial oxide layer, thereby producing a high voltage first-type field region of the high voltage transistor.

In an embodiment, the substrate is a P-type silicon substrate, the first sacrificial oxide layer is a pad oxide layer, and the hard mask layer is a silicon nitride layer.

In an embodiment, the step of removing the hard mask layer is performed by treating the silicon nitride layer with a hot phosphoric acid solution.

In an embodiment, the step of forming the second sacrificial oxide layer is performed by a low-temperature deposition process.

In an embodiment, the low-temperature deposition process is performed by carrying out a low-pressure tetraethylorthosilicate chemical vapor deposition to form a silicon oxide layer.

In an embodiment, the second sacrificial oxide layer has a thickness in a range from 50 to 200 angstroms.

In an embodiment, the low-pressure tetraethylorthosilicate chemical vapor deposition is carried out at about 680° C.

In an embodiment, the step of forming the second sacrificial oxide layer is performed by a spin-on glass process.

In an embodiment, the second sacrificial oxide layer is made of silicon oxide, silicon oxynitride, silicon carbide, silicon oxycarbide or silicon carbonitride.

In an embodiment, the dopant is an N-type dopant, and the high voltage first-type field region is a high voltage N-field region.

In an embodiment, before the step of removing the hard mask layer, the method further includes a step of forming a shallow trench isolation structure in the substrate.

In an embodiment, after the high voltage first-type field region is formed, the method further includes a step of removing the second sacrificial oxide layer.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
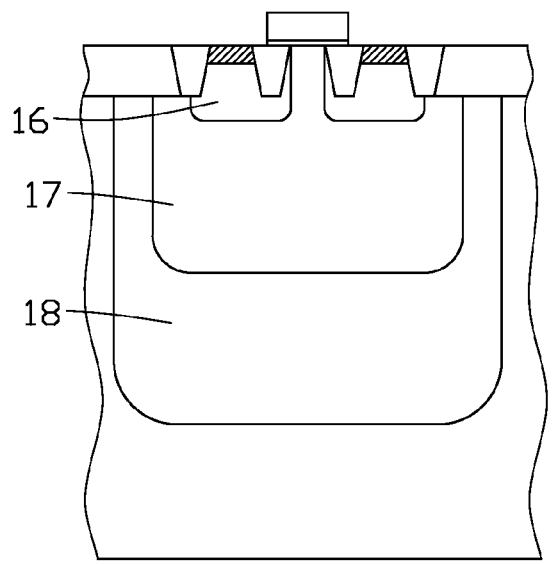
FIG. 1 is a schematic cross-sectional view illustrating an isolated high voltage N-channel metal-oxide-semiconductor field-effect transistor.

FIG. 1 is a schematic cross-sectional view illustrating an isolated high voltage N-channel metal-oxide-semiconductor field-effect transistor.

In the isolated HV-NMOS of FIG. 1, a high voltage N-field (HVNF) region 16, an isolated high voltage P-well (ISO_H-VPW) region 17 and an isolated deep N-well (ISO_DNW) region 18 are formed by using different ion-implanting processes to dope the substrate with different dopants. It is important to precisely control the depth of the HVNF region 16. If the HVNF region 16 is deeper than the desired position, the HVNF region 16 is very close to the ISO_DNW region 18. Under this circumstance, a current leakage problem possibly occurs, and thus the charge pump circuit usually has a failure. For controlling the depth of the high voltage N-field region, the present invention provides a method for fabricating a high voltage metal-oxide-semiconductor field-effect transistor.

Figure 2A:
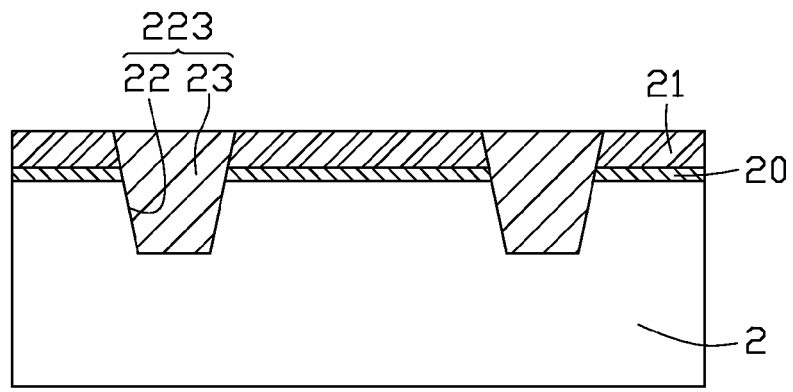
FIGS. 2A~2C are schematic cross-sectional views illustrating a method for fabricating a high voltage metal-oxide-semiconductor field-effect transistor according to an embodiment of the present invention.
Figure 2B:
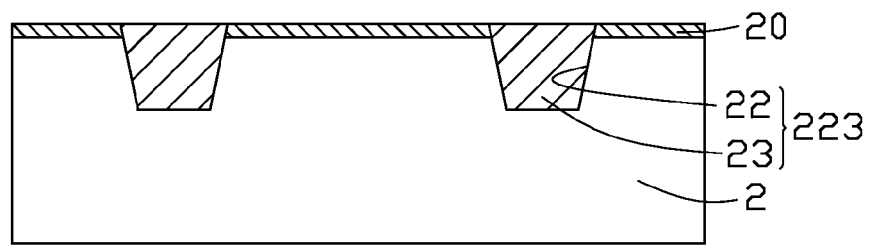
Figure 2C:
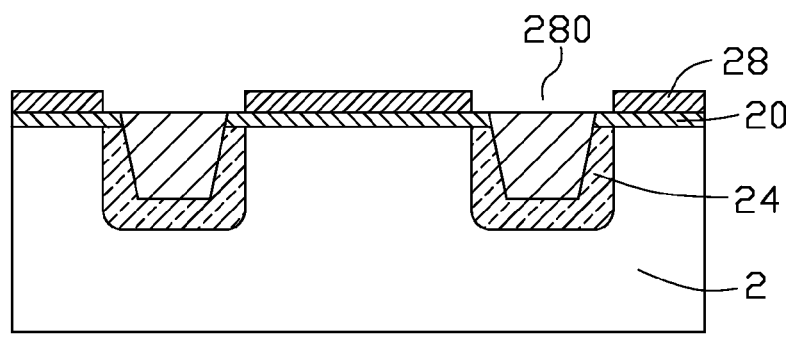

FIGS. 2A~2C are schematic cross-sectional views illustrating a method for fabricating a high voltage metal-oxide-semiconductor field-effect transistor according to an embodiment of the present invention.

Firstly, as shown in FIG. 2A, a pad oxide layer 20 and a silicon nitride layer 21 are sequentially formed on a P-type silicon substrate 2. A photolithography and etching process is performed to form a shallow trench 22 in the P-type silicon substrate 2. Then, a shallow trench isolation material 23 is filled into the shallow trench 22, thereby forming a shallow trench isolation structure 223.

The above structure is then immersed in a hot phosphoric acid ($H_3PO_4$) solution for about 3600 seconds to remove the silicon nitride layer 21. After the silicon nitride layer 21 is removed, the remaining pad oxide layer 20 is used as a sacrificial oxide layer (see FIG. 2B).

Then, a patterned photoresist layer 28 is formed on the pad oxide layer 20. Through the openings 280 of the patterned photoresist layer 28, an ion-implanting process is performed to dope the P-type silicon substrate 2. Consequently, a high voltage N-field (HVNF) region 24 is formed in the P-type silicon substrate 2 (see FIG. 2C).

Since silicon is a crystalline material with a good crystal lattice structure, the ion-implanting process may result in a channeling effect. Due to the channeling effect, the doped region is formed at a position deeper than the desired position. In the above embodiment of the present invention, the use of the sacrificial oxide layer can prevent generation of the channeling effect during the ion-implanting process of forming the HVNF region 24. Since the possibility of causing the HVNF region to be close to the isolated deep N-well region is minimized, the drawbacks encountered from the prior art will be obviated.

However, the above method for forming the HVNF region still has some drawbacks. For example, in the step of removing the silicon nitride layer 21, a number of wafers in the same batch (e.g. several tens of wafers) are sequentially immersed in the hot phosphoric acid solution, which is stored in the same container. Due the concentration difference between the fresher solution and the older solution, the sacrificial oxide layers of the same batch of wafers usually have obvious thickness variation. For example, prior to the treatment of the hot phosphoric acid solution, the thickness of the pad oxide layer 20 of any wafer is about 110 angstroms. In a case that the wafer is treated with the fresh hot phosphoric acid solution, the thickness of the remaining pad oxide layer 20 is about 70angstroms. Whereas, since the last ones of the same-batch wafers are treated with the older hot phosphoric acid solution, the thickness of the remaining pad oxide layer 20 is about 100 angstroms. That is, the sacrificial oxide layers of the same-batch wafers have obvious thickness variation. Due to the thickness variation, the subsequent process of forming the HVNF region may result in depth variation. Experiments show that if the thickness of the remaining pad oxide layer 20 is smaller than 80 angstroms, the current leakage problem becomes more serious. Therefore, the above method needs to be further improved.

For solving the above problems, the present invention further provides another method for fabricating the high voltage metal-oxide-semiconductor field-effect transistor. FIGS. 3A~3E are schematic cross-sectional views illustrating a method for fabricating a high voltage metal-oxide-semiconductor field-effect transistor according to another embodiment of the present invention.

Figure 3A:
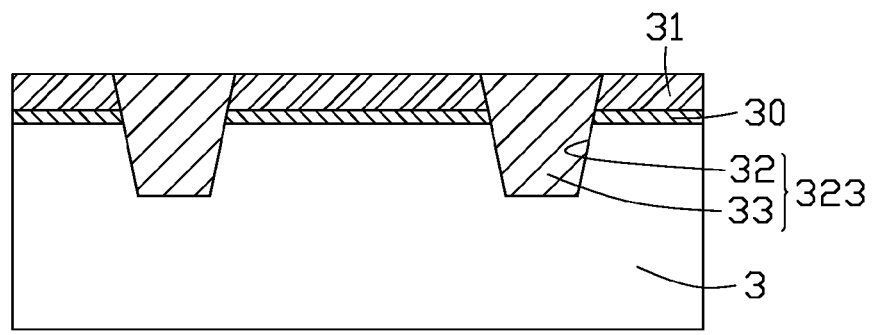
FIGS. 3A~3E are schematic cross-sectional views illustrating a method for fabricating a high voltage metal-oxide-semiconductor field-effect transistor according to another embodiment of the present invention.
Figure 3B:
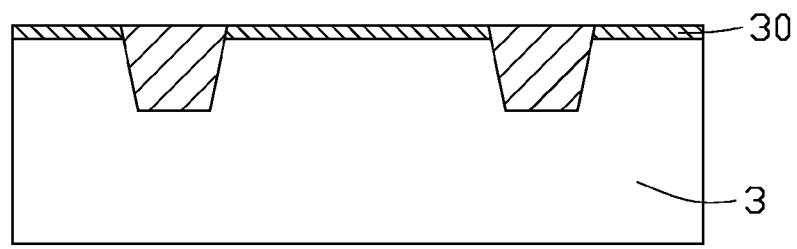
Figure 3C:
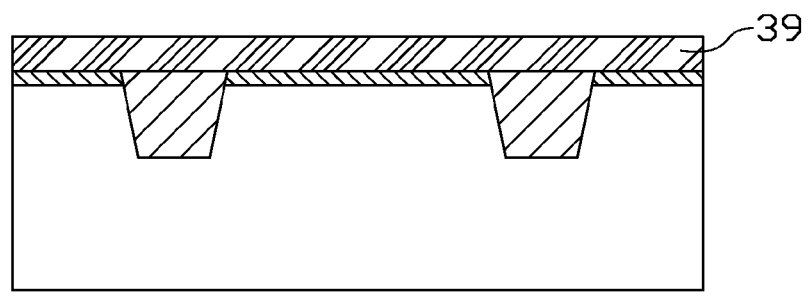

Firstly, as shown in FIG. 3A, a pad oxide layer 30 and a silicon nitride layer 31 are sequentially formed on a P-type silicon substrate 3. A photolithography and etching process is performed to form a shallow trench 32 in the P-type silicon substrate 3. Then, a shallow trench isolation material 33 is filled into the shallow trench 32, thereby forming a shallow trench isolation structure 323.

The above structure is then immersed in a hot phosphoric acid ($H_3PO_4$) solution for about 3600 seconds to remove the silicon nitride layer 31. After the silicon nitride layer 31 is removed, the remaining pad oxide layer 30 is used as a sacrificial oxide layer (see FIG. 3B).

The pad oxide layer 30 is usually formed by carrying out a thermal oxidation process at a temperature of about 1100° C. Although the increase of the operating time period of the thermal oxidation process is effective to increase the thickness of the pad oxide layer 30, the device performance will be deteriorated because the thermal budget is improperly increased. For reducing the thermal budget, a low-temperature deposition process is performed to form an auxiliary sacrificial oxide layer 39 on the pad oxide layer 30 (see FIG. 3C). In an embodiment, the low-temperature deposition process is performed by carrying out a low-pressure tetraethylorthosilicate chemical vapor deposition (LP-TEOS CVD) process to deposit a silicon oxide layer (i.e. the auxiliary sacrificial oxide layer) on the pad oxide layer 30. The thickness of the auxiliary sacrificial oxide layer 39 is in the range from 50 to 200 angstroms. In an embodiment, the low-pressure tetraethylorthosilicate chemical vapor deposition process is carried out at a low temperature such as 680° C. In such way, the auxiliary sacrificial oxide layer 39 can be formed without increasing the thermal budget. Alternatively, in some embodiments, the auxiliary sacrificial oxide layer 39 is a silicon oxide layer formed by a spin-on glass (SOG) process. In the above embodiment, the auxiliary sacrificial oxide layer 39 is made of silicon oxide. Alternatively, in some embodiments, the auxiliary sacrificial oxide layer 39 may be made of silicon oxynitride, silicon carbide, silicon oxycarbide or silicon carbonitride.

Figure 3D:
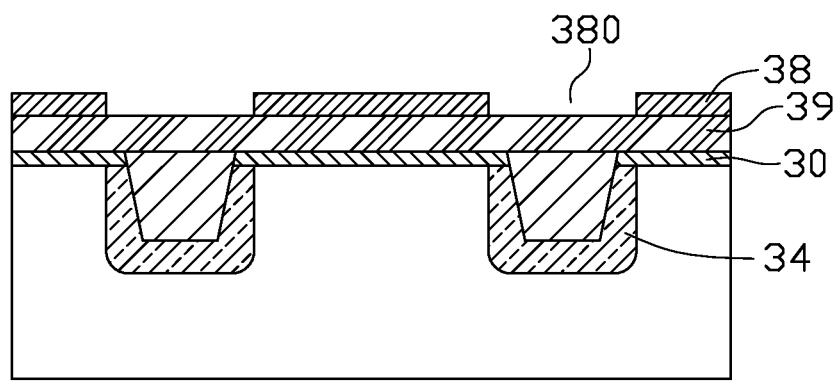

Then, as shown in FIG. 3D, a patterned photoresist layer 38 with openings 380 is formed on the auxiliary sacrificial oxide layer 39. By using the patterned photoresist layer 38 as an implantation mask, an ion-implanting process is performed to introduce an N-type dopant into the P-type silicon substrate 3 through the auxiliary sacrificial oxide layer 39 and the pad oxide layer 30. Consequently, a high voltage N-field (HVNF) region 34 is formed in the P-type silicon substrate 3.

Figure 3E:
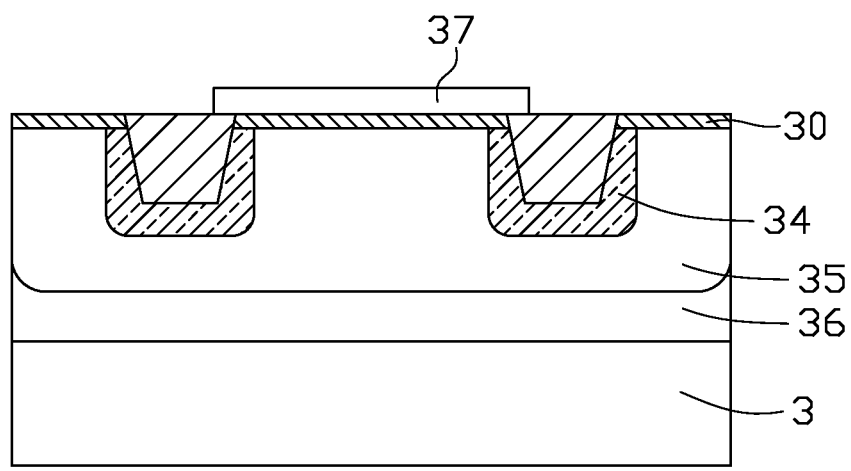

After the high voltage N-field region 34 is performed, the auxiliary sacrificial oxide layer 39 is removed (see FIG. 3E). After the auxiliary sacrificial oxide layer 39 is removed, the subsequent process will be done. For example a series of ion-implanting processes are performed to dope the substrate 3 with different dopants, thereby forming a high voltage P-field region 35 and a deep N-well region 36. The resulting structure of the high voltage N-channel metal-oxide-semiconductor field-effect transistor with a gate structure 37 is shown in FIG. 3E.

From the above description, since the depth of the high voltage N-field region can be precisely controlled, the depth variation will be reduced or eliminated. As a consequently, the performance of the high voltage metal-oxide-semiconductor field-effect transistor will be enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a high voltage transistor, the method comprising steps of:
   providing a substrate;
   sequentially forming a first sacrificial oxide layer and a hard mask layer over the substrate;
   removing the hard mask layer, thereby exposing the first sacrificial oxide layer;
   forming a second sacrificial oxide layer on the first sacrificial oxide layer; and
   performing an ion-implanting process to introduce a dopant into the substrate through the second sacrificial oxide layer and the first sacrificial oxide layer, thereby producing a high voltage first-type field region of the high voltage transistor.

2. The method according to claim 1, wherein the substrate is a P-type silicon substrate, the first sacrificial oxide layer is a pad oxide layer, and the hard mask layer is a silicon nitride layer.

3. The method according to claim 2, wherein the step of removing the hard mask layer is performed by treating the silicon nitride layer with a hot phosphoric acid solution.

4. The method according to claim 1, wherein the step of forming the second sacrificial oxide layer is performed by a low-temperature deposition process.

5. The method according to claim 4, wherein the low-temperature deposition process is performed by carrying out a low-pressure tetraethylorthosilicate chemical vapor deposition to form a silicon oxide layer.

6. The method according to claim 5, wherein the second sacrificial oxide layer has a thickness in a range from 50 to 200 angstroms.

7. The method according to claim 5, wherein the low-pressure tetraethylorthosilicate chemical vapor deposition is carried out at about 680° C.

8. The method according to claim 1, wherein the step of forming the second sacrificial oxide layer is performed by a spin-on glass process.

9. The method according to claim 1, wherein the second sacrificial oxide layer is made of silicon oxide, silicon oxynitride, silicon carbide, silicon oxycarbide or silicon carbonitride.

10. The method according to claim 1, wherein the dopant is an N-type dopant, and the high voltage first-type field region is a high voltage N-field region.

11. The method according to claim 1, wherein before the step of removing the hard mask layer, the method further comprises a step of forming a shallow trench isolation structure in the substrate.

12. The method according to claim 1, wherein after the high voltage first-type field region is formed, the method further comprises a step of removing the second sacrificial oxide layer.

* * * * *